(12) United States Patent
Sunaga et al.

(10) Patent No.: US 11,541,477 B2
(45) Date of Patent: Jan. 3, 2023

(54) ULTRASONIC BONDING DEVICE AND ULTRASONIC BONDING METHOD

(71) Applicant: TDK CORPORATION, Tokyo (JP)

(72) Inventors: Seijiro Sunaga, Tokyo (JP); Toshinobu Miyagoshi, Tokyo (JP); Mitsuyoshi Makida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 74 days.

(21) Appl. No.: 16/431,922

(22) Filed: Jun. 5, 2019

(65) Prior Publication Data

US 2019/0375041 A1     Dec. 12, 2019

(30) Foreign Application Priority Data

Jun. 7, 2018   (JP) .............................. JP2018-109768

(51) Int. Cl.
| | | |
|---|---|---|
| *B23K 20/00* | (2006.01) | |
| *G02F 1/1345* | (2006.01) | |
| *H01L 23/00* | (2006.01) | |
| *G02F 1/13* | (2006.01) | |
| *H05K 13/00* | (2006.01) | |
| *H05K 3/36* | (2006.01) | |
| *H01L 21/607* | (2006.01) | |

(52) U.S. Cl.
CPC .......... *B23K 20/002* (2013.01); *G02F 1/1345* (2013.01); *H01L 24/74* (2013.01); *G02F 1/1303* (2013.01); *H01L 21/607* (2021.08); *H01L 24/75* (2013.01); *H05K 3/361* (2013.01); *H05K 13/00* (2013.01)

(58) Field of Classification Search
CPC .. G02F 1/1345; G02F 1/13452; G02F 1/1303; H05K 3/368; H05K 3/361; H01L 24/75
See application file for complete search history.

(56) References Cited

U.S. PATENT DOCUMENTS

| | | | |
|---|---|---|---|
| 2004/0060666 A1* | 4/2004 | Nishino | ................. H05K 1/118 156/580 |
| 2011/0120767 A1 | 5/2011 | Sato et al. | |
| 2013/0112735 A1 | 5/2013 | Luechinger et al. | |
| 2016/0111395 A1* | 4/2016 | Heinrich | ............. H01L 23/4827 438/107 |
| 2019/0223289 A1* | 7/2019 | Kim | ................. G02F 1/136277 |

FOREIGN PATENT DOCUMENTS

| | | |
|---|---|---|
| JP | H05-115986 A | 5/1993 |
| JP | 2008-296161 A | 12/2008 |
| JP | 2009-054377 A | 3/2009 |
| JP | 2014-072270 A | 4/2014 |
| JP | 2016-186517 A | 10/2016 |

* cited by examiner

*Primary Examiner* — Alexander P Gross
(74) *Attorney, Agent, or Firm* — Oliff PLC

(57) ABSTRACT

An ultrasonic bonding device includes a stage and an ultrasonic horn. A first flat member and a second flat member to be bonded are placed on the stage. The ultrasonic horn includes a press part to be pressed on a laminated portion of the first flat member and the second flat member. The stage includes a lower-side surface, a higher-side surface, and a step wall surface. The first flat member is to be placed on the lower-side surface. The higher-side surface is positioned higher than the lower-side surface by a predetermined step height. The second flat member is to be placed on the higher-side surface. The step wall surface is positioned in a boundary between the lower-side surface and the higher-side surface.

6 Claims, 6 Drawing Sheets

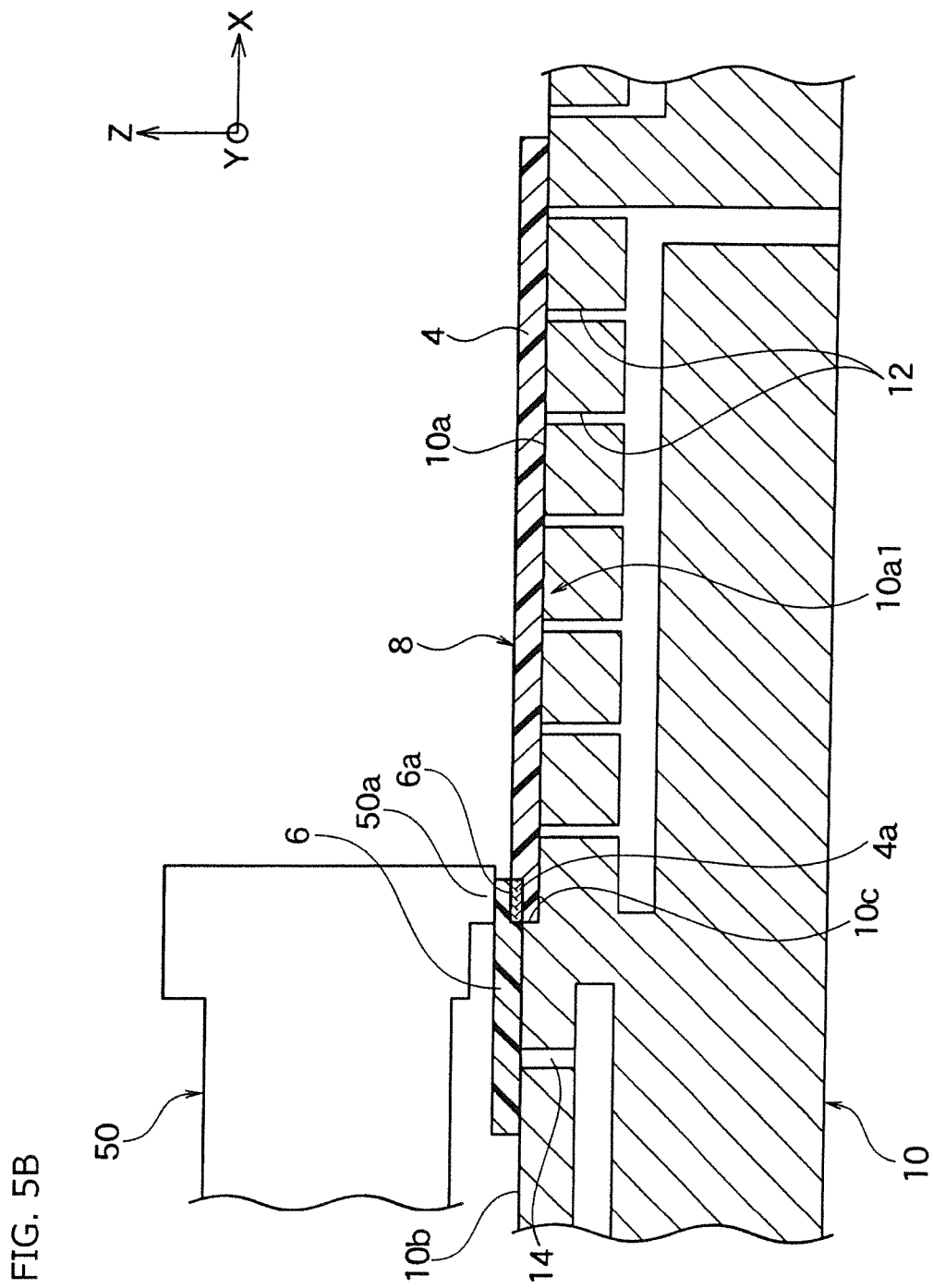

ULTRASONIC BONDING DEVICE AND ULTRASONIC BONDING METHOD

BACKGROUND OF THE INVENTION

The present invention relates to an ultrasonic bonding device and to an ultrasonic bonding method.

For example, as shown in Patent Document 1, known is a technique of connecting a wiring of a glass board to be a display screen board with a flexible printed circuit (FPC) or so via an anisotropic conductive film (hereinafter, ACF).

In recent years, however, a pitch interval of wiring patterns has been smaller, and a short-circuit failure between wirings has been becoming a problem in connection by ACF.

Patent Document 1: JP2016186517 (A)

BRIEF SUMMARY OF INVENTION

The present invention has been achieved under such circumstances. It is an object of the invention to provide an ultrasonic bonding device and an ultrasonic bonding method capable of easily electrically connecting flat members without generation of short-circuit failure or so even if a wiring pitch interval is small.

To achieve the above object, an ultrasonic bonding device according to the present invention includes:
 a stage for placing a first flat member and a second flat member to be bonded; and
 an ultrasonic horn including a press part to be pressed on a laminated portion of the first flat member and the second flat member,
 wherein the stage includes:
 a lower-side surface on which the first flat member is to be placed;
 a higher-side surface positioned higher than the lower-side surface by a predetermined step height and on which the second flat member is to be placed; and
 a step wall surface positioned in a boundary between the lower-side surface and the higher-side surface.

To ultrasonically bond the first flat member and the second flat member using the ultrasonic bonding device according to the present invention, the first flat member is initially placed on the lower-side surface so that the edge of the first flat member is aligned to the step wall surface. Then, the second flat member is placed on the higher-side surface so as to form a laminated portion constituted by laminating at least a part of the second flat member on the first flat member. After that, the press part of the ultrasonic horn is pressed against the laminated portion at a position corresponding to the step wall surface, and the ultrasonic bonding is thereby completed.

Since the step wall surface is formed on the stage, the ultrasonic bonding device according to the present invention easily positions the first flat member and the second flat member using the step wall surface and can ultrasonically bond their wiring patterns. Thus, even if the wiring pitch interval is small (e.g., tens of microns or less), the flat members are easily electrically connected without generation of short-circuit failure or so.

In recent years, a large display close to an outer casing size of a device (e.g., a display of smart phones) has been demanded. Thus, the bonding length of the wiring patterns must be short, and the connection reliability is becoming a problem. In the device of the present invention, however, metals can ultrasonically be solid-phase bonded, and the connection becomes reliable.

In the ultrasonic bonding device according to the present invention, since the step wall surface is formed on the stage, the wiring patterns can securely ultrasonically be bonded even if the laminated portion of the first flat member and the second flat member has a large width (e.g., 60 mm or more).

Preferably, the stage further includes: a first fixing means for detachably fixing the first flat member on the lower-side surface so that an edge of the first flat member is positioned by contacting with the step wall surface; and a second fixing means for detachably fixing the second flat member on the higher-side surface so that at least a part of the second flat member is laminated on the first flat member.

The first fixing means is not limited and is, for example, a plurality of first suction holes formed on the lower-side surface of the stage. When a negative pressure applies to the plurality of first suction holes, the first flat member can detachably be fixed on the lower-side surface. Likewise, the second fixing means is not limited and is, for example, a plurality of second suction holes formed on the higher-side surface of the stage. When a negative pressure applies to the plurality of second suction holes, the second flat member can detachably be fixed on the higher-side surface.

Preferably, the ultrasonic bonding device according to the present invention further includes: a movement mechanism for relatively moving the ultrasonic horn to the stage; and a control means for controlling the movement mechanism so that the press part of the ultrasonic horn presses the laminated portion at a position corresponding to the step wall surface.

The movement mechanism may be a mechanism where the ultrasonic horn moves to the stage, a mechanism where the stage moves to the ultrasonic horn, or a mechanism where both the ultrasonic horn moves to the stage and the stage moves to the ultrasonic horn. The movement mechanism includes at least a mechanism for relatively moving the ultrasonic horn to or from the stage. Preferably, the movement mechanism also includes a mechanism for relatively moving the ultrasonic horn to the stage in the plane direction.

Preferably, the step height is equal to or less than a thickness of the first flat member. In this structure, even if the stage has manufacturing errors, the upper surface of the first flat member is not lower than the higher-side surface and is flush with the higher-side surface or slightly protrudes upward. Thus, when the second flat member is placed on the higher-side surface, the first flat member and the second flat member always contact with each other at their laminated portion (overlapping portion). Thus, the first flat member and the second flat member can securely ultrasonically be bonded, and the connection becomes more reliable.

Preferably, the movement mechanism is controlled by the control means so that the press part of the ultrasonic horn presses the laminated portion positioned on the lower-side surface in a predetermined range from the step wall surface. In the ultrasonic bonding, the press part of the ultrasonic horn does not preferably press the second flat member positioned on the higher-side surface, but preferably presses only the laminated portion. In this structure, the ultrasonic bonding of the wiring patterns becomes more reliable without generation of disconnection of the wiring patterns or so.

An ultrasonic bonding method according to the present invention includes the steps of:
 preparing a stage including a lower-side surface, a higher-side surface positioned higher than the lower-side surface by a predetermined step height, and a step wall surface positioned in a boundary between the lower-side surface and the higher-side surface;

placing a first flat member on the lower-side surface so that an edge of the first flat member is aligned to the step wall surface;

placing a second flat member on the higher-side surface so as to form a laminated portion constituted by laminating at least a part of the second flat member on the first flat member; and pressing a press part of an ultrasonic horn against the laminated portion at a position corresponding to the step wall surface.

In the ultrasonic bonding method according to the present invention, since the step wall surface is formed on the stage, the first flat member and the second flat member are easily positioned using the step wall surface, and the wiring patterns can ultrasonically be bonded. Thus, even if the wiring pitch interval is small (e.g., tens of microns or less), the flat members are easily electrically connected without generation of short-circuit failure or so. Incidentally, it is preferred that the ultrasound does not vibrate in the lamination direction of the laminated portion, but vibrates in a direction along the longitudinal direction of the wiring patterns to be bonded.

In recent years, a large display close to an outer casing size of a device (e.g., a display of smart phones) has been demanded. Thus, the bonding length of the wiring patterns must be short, and the connection reliability is becoming a problem. In the method of the present invention, however, metals can ultrasonically be solid-phase bonded, and the connection becomes more reliable.

In the ultrasonic bonding method according to the present invention, since the step wall surface is formed on the stage, the wiring patterns can securely ultrasonically be bonded even if the laminated portion of the first flat member and the second flat member has a large width (e.g., 60 mm or more).

Preferably, a first metal is formed on a surface of the first flat member to be laminated with the second flat member, a second metal is formed on a surface of the second flat member to be laminated with the first flat member, and the first metal and the second metal are ultrasonically solid-phase bonded in the laminated portion to be contacted with the press part of the ultrasonic horn.

Preferably, a connection part of the wiring pattern formed on the first flat member is formed by the first metal, and a connection part of the wiring pattern formed on the second flat member is formed by the second metal. These metals are ultrasonically solid-phase bonded. These metals may be any metal capable of ultrasonic bonding (including alloy), such as silver, gold, aluminum, and alloys containing these as main components. Incidentally, an antioxidant film whose main component is titanium or so may be formed on the surface of these metals.

BRIEF DESCRIPTION OF DRAWINGS

FIG. 5B is a schematic view illustrating the next step of FIG. 5A.

DETAILED DESCRIPTION OF INVENTION

Hereinafter, the present invention is described based on an embodiment shown in the figures.

Figure 1:
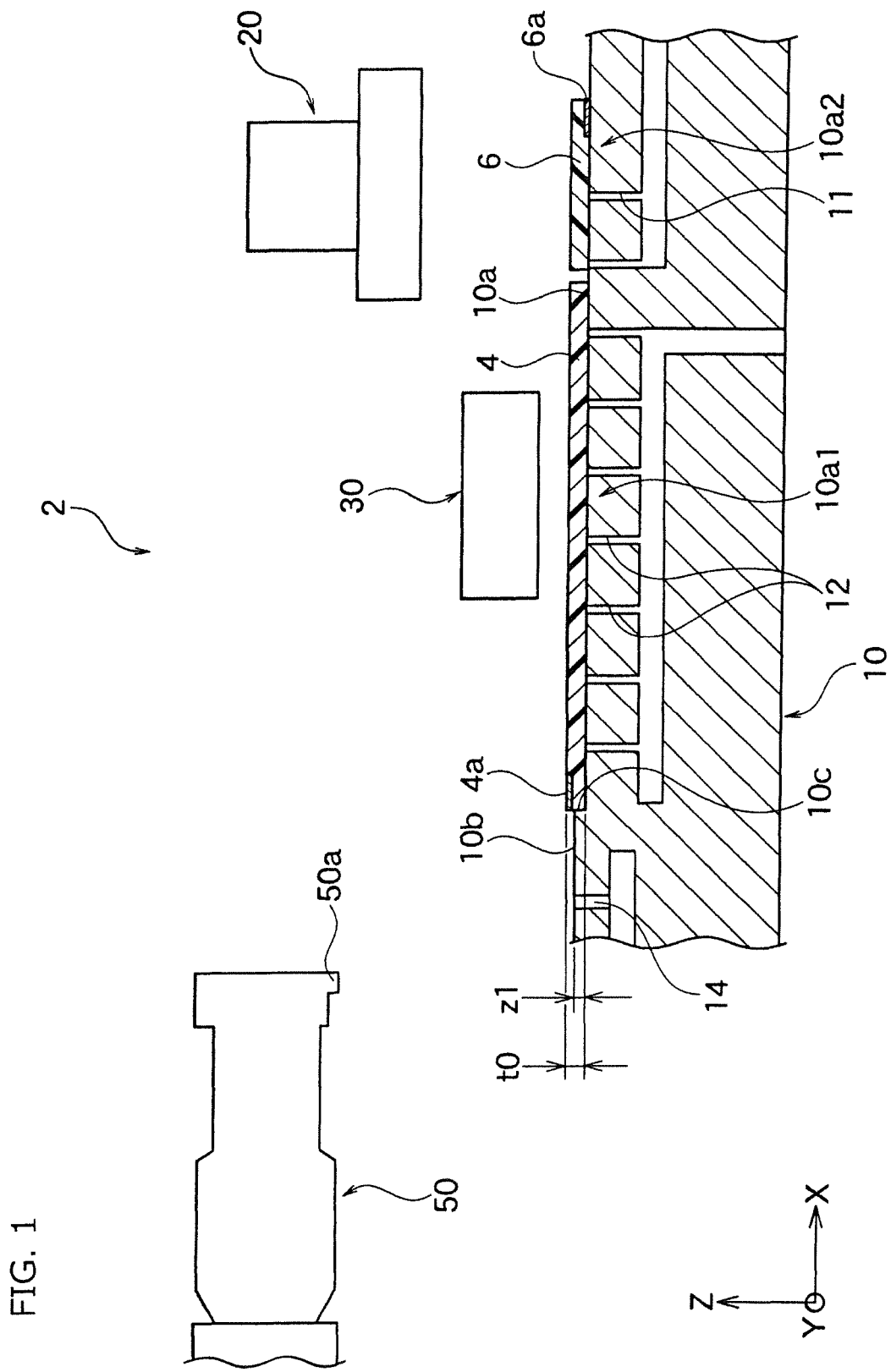
FIG. 1 is a schematic overview of an ultrasonic bonding device according to an embodiment of the present invention.

Described is a manner of manufacturing a board bonded body 8 shown in FIG. 5B by an ultrasonic bonding method shown in FIG. 2 to FIG. 5B using an ultrasonic bonding device 2 according to an embodiment of the present invention shown in FIG. 1.

As shown in FIG. 5B, the board bonded body 8 includes an electronic control board 4 (first flat member) and a flexible board 6 (second flat member). The electronic control board 4 may be a liquid crystal display panel, an organic EL display panel, or another display panel and may include, for example, a glass board.

The flexible board 6 is a board for supplying any signal and electric power to the electronic control board 4. A wiring pattern 4a of the electronic control board 4 and a wiring pattern 6a of the flexible board 6 are electrically connected to each other per pattern.

In the board bonded body 8 shown in FIG. 5B, after the wiring pattern 4a and the wiring pattern 6a are ultrasonically bonded, the flexible board 6 is bent from the edge near the wiring pattern 4a of the electronic control board 4 to the backside and is, for example, contained in a casing of a smart phone. In this structure, the entire surface close to the outer shape size of the casing can be utilized as a display screen of the electronic control board 4.

In view of this, an overlapping width x1 of the wiring pattern 4a and the wiring pattern 6a in the X-axis direction (see FIG. 5A) is demanded to be smaller as much as possible, such as 0.5 mm or less (preferably, 0.2 mm or less). In accordance with high refinement of displays, a wiring pitch interval of the wiring pattern 4a and the wiring pattern 6a in the Y-axis direction becomes smaller, such as tens of microns or smaller (preferably, 20 µm or less). In the figures, the board 6 is illustrated to be as thick as the board 4, but the board 6 is actually thinner than the board 4. Instead, the board 6 may be as thick as the board 4 or may be thicker than the board 4.

In the present embodiment, the ultrasonic bonding device 2 shown in FIG. 1 is used for electrically connecting the wiring pattern 4a of the electronic control board 4 with the wiring pattern 6a of the flexible board 6 per pattern.

As shown in FIG. 1, the ultrasonic bonding device 2 of the present embodiment includes a stage 10 and an ultrasonic horn 50. The electronic control board 4 and the flexible board 6 to be bonded are placed on the stage 10. The ultrasonic horn 50 includes a press part 50a for pressing a lamination portion of the electronic control board 4 and the flexible board 6.

A transportation head 20 is disposed above the stage 10 in the Z-axis direction so as to be relatively movable to the stage 10 in the X-axis direction, the Y-axis direction, and the Z-axis direction. While shifting from the transportation head 20 in the Z-axis direction, a camera 30 is disposed above the stage 10 in the Z-axis direction so as to be relatively movable to the stage 10 at least in the X-axis direction and the Y-axis direction. As with the transportation head 20, the camera 30 may also be disposed so as to be relatively movable to the stage 10 in the Z-axis direction.

The ultrasonic horn 50 is disposed so as not to collide with the transportation head 20 and the camera 30 and so as to be relatively movable to the stage 10 in the X-axis direction, the Y-axis direction, and the Z-axis direction. The term "relatively movable" means that one may be movable to the other, the other may be movable to one, or one and the other may mutually be movable, and a relative position between one and the other changes.

A relative movement of the stage 10, the ultrasonic horn 50, a suction head 20, and the camera 30 is controlled by a control means (not illustrated). The control means may also control the device 2. The control means may also process an image obtained by the camera 30 and control a negative pressure of suction holes 11, 12, and 14 mentioned below. The control means may be a special circuit or may be constituted by a general-purpose computer with control program.

In the figures, the X-axis, the Y-axis, and the Z-axis are substantially perpendicular to each other. The Z-axis corresponds to a height direction of the device 2, the X-axis corresponds to a longitudinal direction of the electronic control board 4 or the flexible board 6, and the Y-axis corresponds to a width direction of the electronic control board 4 or the flexible board 6. The X-axis and the Y-axis are substantially parallel to the display of the electronic control board 4.

The upper surface of the stage 10 in the Z-axis direction includes at least a lower-side surface 10a, a higher-side surface 10b, and a step wall surface 10c. The electronic control board 4 is placed on the lower-side surface 10a. The higher-side surface 10b is positioned higher than the lower-side surface 10a by a step height $z1$. The step wall surface 10c is positioned in a boundary between the lower-side surface 10a and the higher-side surface 10b. The lower-side surface 10a and the higher-side surface 10b are substantially parallel to the X-Y axis plane. The step wall surface 10c is substantially parallel to the Z-Y axis plane.

The lower-side surface 10a includes a bonding position 10a1 and a standby position 10a2. The electronic control board 4 is placed at the bonding position 10a1. The flexible board 6 is temporarily placed at the standby position 10a2 away from the bonding position 10a1 in the X-axis direction (or the Y-axis direction). A plurality of first suction holes 12 formed inside the stage 10 is open at the bonding position 10a1 on the lower-side surface 10a. A plurality of standby suction holes 11 formed inside the stage 10 is open at the standby position 10a2 on the lower-side surface 10a.

When a negative pressure applies to the first suction holes 12, the electronic control board 4 placed at the bonding position 10a1 can detachably temporarily be suctioned and fixed at the bonding position 10a1 on the lower-side surface 10a. At the bonding position 10a1, the electronic control board 4 is disposed so that a connection scheduled part of the wiring pattern 4a formed on the board 4 faces upward in the Z-axis direction and so that the edge of the board 4 near the connection scheduled part of the wiring pattern 4a bumps into (contacts with) the step wall surface 10c. For example, the suction head 20 shown in FIG. 1 or another suction head can be used as a means for disposing the electronic control board 4 at the bonding position 10a1 on the lower-side surface 10a in the above-mentioned manner.

When a negative pressure applies to the standby suction holes 11, the flexible board 6 placed at the standby position 10a2 can detachably temporarily be suctioned and fixed at the standby position 10a2 on the lower-side surface 10a. At the standby position 10a2, the flexible board 6 is disposed so that a connection scheduled part of the wiring pattern 6a formed on the board 6 faces downward in the Z-axis direction and so that the edge of the board 6 near the connection scheduled part of the wiring pattern 6a faces the opposite side of the electronic control board 4 in the X-axis direction. For example, the suction head 20 shown in FIG. 1A can be used as a means for disposing the flexible board 6 at the standby position 10a2 on the lower-side surface 10a in the above-mentioned manner.

In the present embodiment, the step height $z1$ of the step wall surface 10c is equal to or less than the thickness $t0$ of the electronic control board 4, and the difference ($t0-z1$) is preferably 0 to 20 μm, more preferably 10 to 20 μm.

Figure 4:
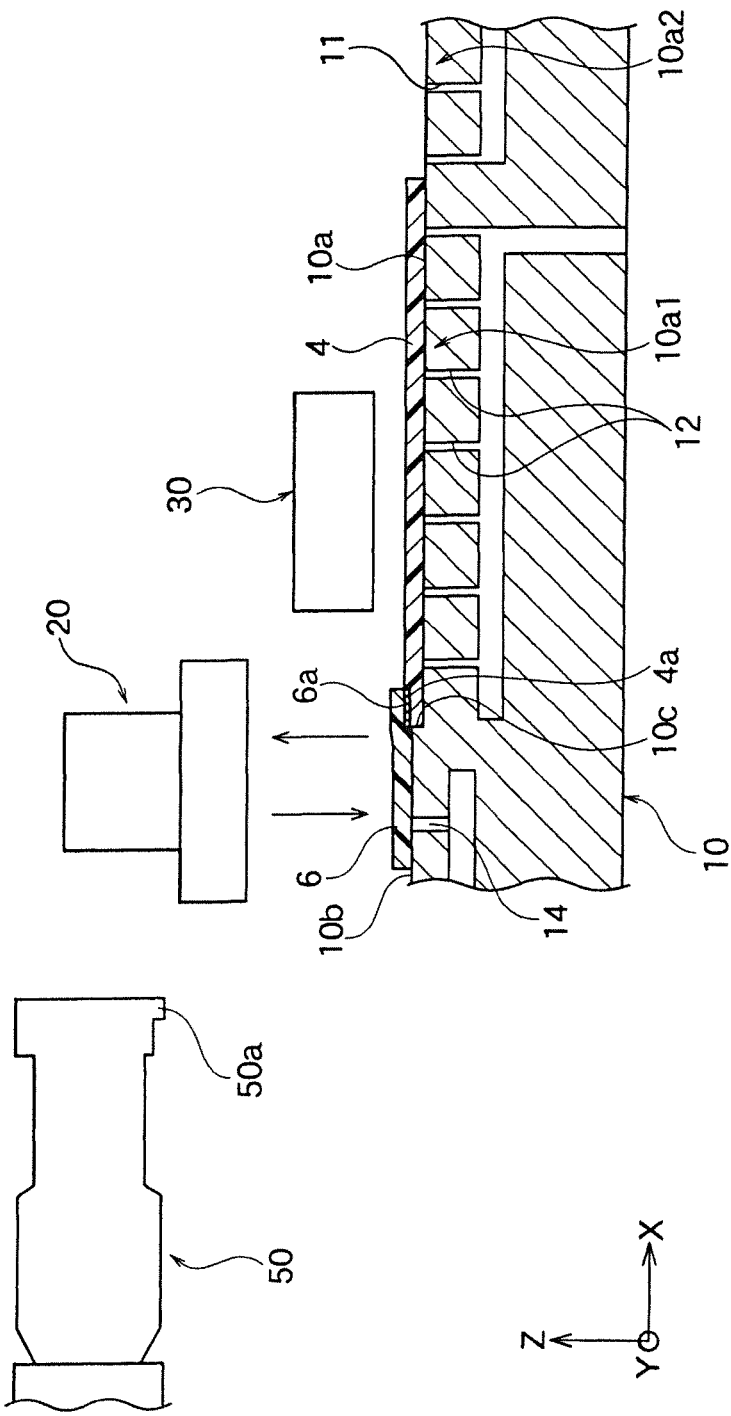
FIG. 4 is a schematic view illustrating the next step of FIG. 3.

In the vicinity of the step wall surface 10c, a plurality of second suction holes 14 formed inside the stage 10 is open to the higher-side surface 10b of the stage 10. When a negative pressure applies to the second suction holes 14, as shown in FIG. 4, the flexible board 6 placed on the higher-side surface 10b can detachably temporarily be suctioned and fixed to the higher-side surface 10b in the vicinity of the step wall surface 10c. For example, the suction head 20 is used as a means for disposing the flexible board 6 on the higher-side surface 10b in the vicinity of the step wall surface 10c.

Figure 2:
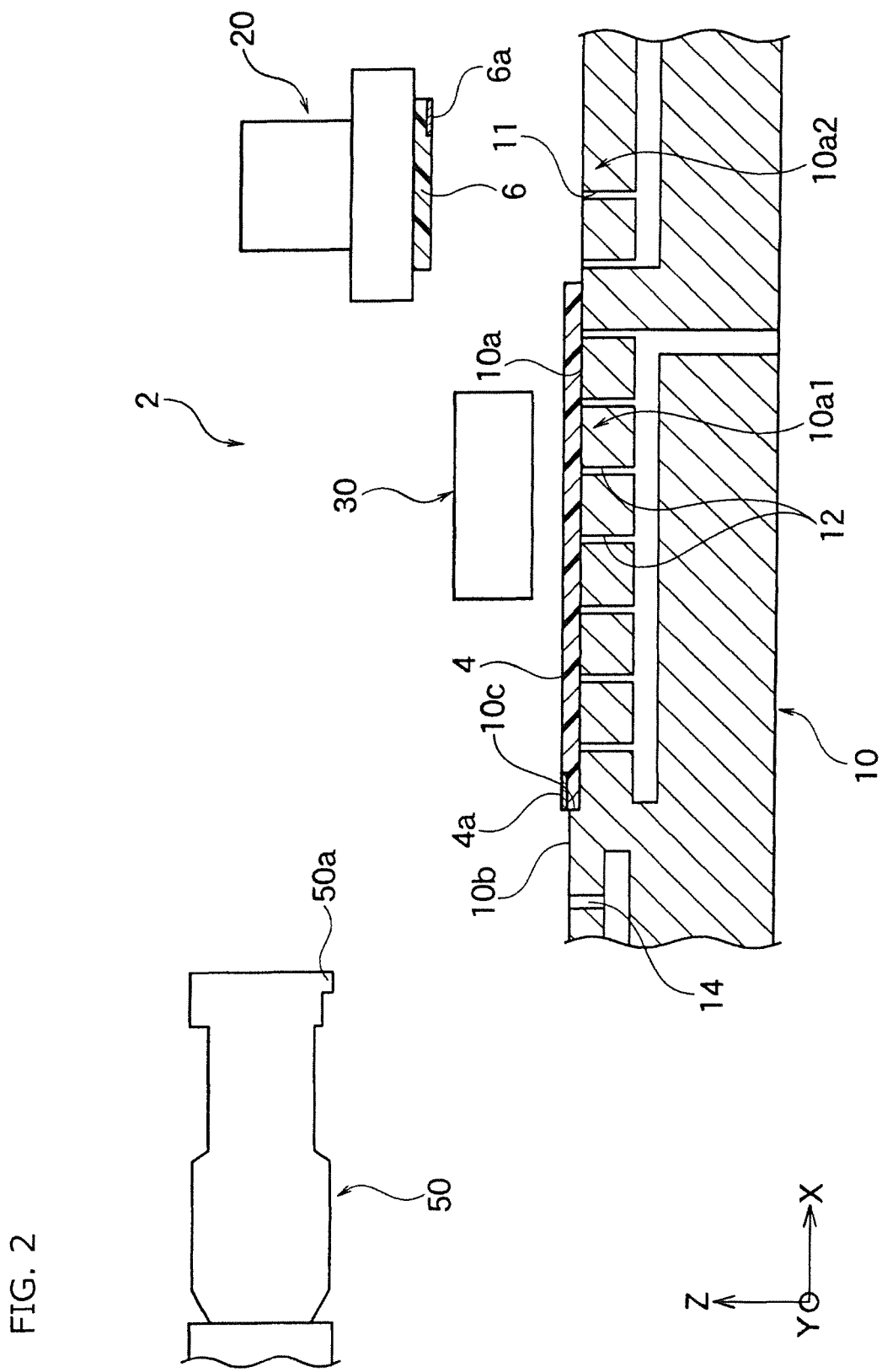
FIG. 2 is a schematic view illustrating a step of an ultrasonic bonding method using the device shown in FIG. 1.

Next, explained is an ultrasonic bonding method using the ultrasonic bonding device 2 shown in FIG. 1. As shown in FIG. 2, the negative pressure of the standby suction hole 11 being open at the standby position 10a2 on the lower-side surface 10a is initially released, and the flexible board 6 positioned at the standby position 10a2 is lifted upward in the Z-axis direction by the suction head 20. The suction head 20 has a mechanism that suctions and holds the board 6 on the lower surface of the suction head 20 by suction force, for example.

Figure 3:
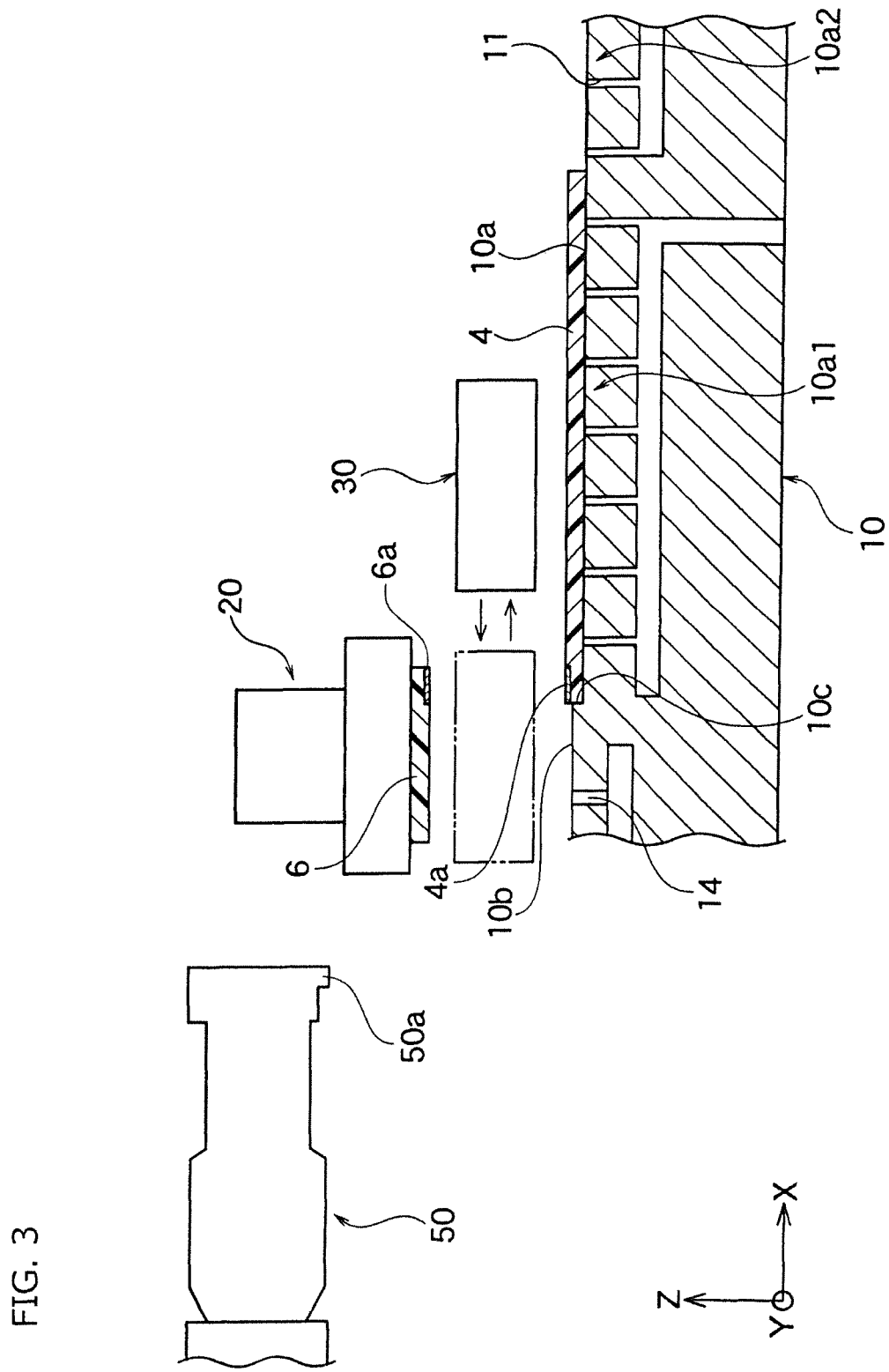
FIG. 3 is a schematic view illustrating the next step of FIG. 2.

After that, as shown in FIG. 3, the suction head 20 moves with the board 6 to the stage 10 in the X-axis direction. Incidentally, the stage 10 may move in the X-axis direction. The suction head 20 relatively moves to the stage 10 in the X-axis direction so that the board 6 held by the suction head 20 is positioned above the higher-side surface 10b in the vicinity of the step wall surface 10c. This movement is controlled by the control means.

The camera 30 enters between the wiring pattern 4a and the wiring pattern 6a and films their positional relation so that the connection scheduled portion of the wiring pattern 6a of the board 6 is accurately positioned with the connection scheduled portion of the wiring pattern 4a of the board 4, and the control means processes the image. Based on the result of the image processing, the control means relatively moves the suction head 20 to the stage 10 in the X-axis direction and the Y-axis direction so that the connection scheduled portion of the wiring pattern 6a of the board 6 is accurately positioned with the connection scheduled portion of the wiring pattern 4a of the board 4. If necessary, the control means may rotate the suction head 20 around the axis of the suction head 20 and move it to the stage 10 by controlling the movement mechanism.

Next the camera 30 moves from between the board 6 and the stage 10 in the X-axis direction and escapes to a position where the movement of the suction head 20 in the Z-axis direction is not disturbed. As shown in FIG. 4, the suction head 20 thereafter moves to the higher-side surface 10b of the stage 10, releases the suction holding of the board 6, and places the board 6 on the higher-side surface 10b. At the same time, a negative pressure applies to the second suction holes 14, and the board 6 is suctioned and held on the higher-side surface 10b. During this state, the lower surface of the edge of the board 6 in the X-axis direction and the upper surface of the edge of the board 4 in the X-axis direction overlap with each other, and a laminated portion is formed at a corresponding position to the step wall surface 10c. In the laminated portion, the connection scheduled portion of the wiring pattern 4a and the connection scheduled portion of the wiring pattern 6a face each other.

Figure 5A:
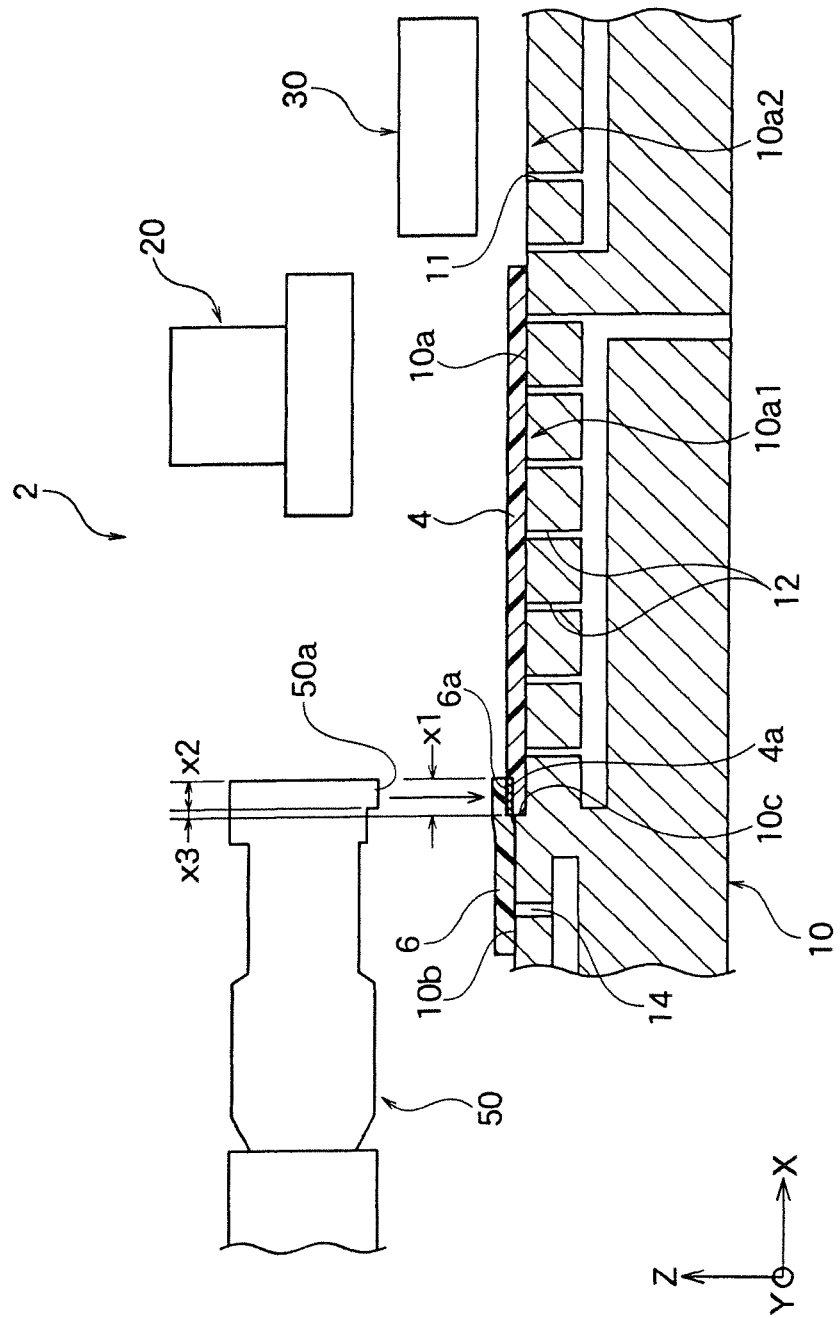
FIG. 5A is a schematic view illustrating the next step of FIG. 4.

Next, as shown in FIG. 5A, the stage 10 relatively moves to the suction head 20 and the camera 30 in the X-axis direction, and the press part 50a of the ultrasonic horn 50 is positioned right above the laminated portion of the wiring patterns 6a and 4a in the Z-axis direction. Incidentally, a relative movement of the stage 10 and the ultrasonic horn 50 in the X-axis direction is controlled in advance so that the press part 50a of the ultrasonic horn 50 is positioned over the lower-side surface 10a within a predetermined range x3 in the X-axis direction.

That is, the movement mechanism is controlled by the control means so that the press part 50a of the ultrasonic horn 50 presses the laminated portion positioned on the lower-side surface 10a within a predetermined range x3 from the step wall surface 10c. Incidentally, the predetermined range x3 is preferably larger than zero and smaller than the length x1 of the laminated portion in the X-axis direction. That is, the press part 50a is controlled so as not to press the surface of the board 6 positioned on the higher-side surface 10b.

The length x1 of the laminated portion in the X-axis direction also corresponds to an overlapping length of the connection scheduled portions of the wiring patterns 4a and 6a and is demanded to be small as much as possible, such as 0.5 mm or less (preferably, 0.2 mm or less). A length x2 of the press part 50a, which presses the overlapping portion of the boards 4 and 6 (laminated portion), in the X-axis direction is preferably equal to or larger than the length x1 of the laminated portion in the X-axis direction. The difference (x2−x1) in length is preferably zero or more and 0.5 mm or less, more preferably 0.01 to 0.08 mm.

Next, as shown in FIG. 5A and FIG. 5B, the ultrasonic horn 50 relatively moves downward to the stage 10 in the Z-axis direction, the press part 50a of the ultrasonic horn 50 presses the laminated portion of the boards 4 and 6, and a press force in the Z-axis direction and an ultrasonic vibration in the X-axis direction are added to the laminated portion. As a result, metals of the wiring patterns 4a and 6a of the laminated portion being long in the X-axis direction and arranged at a predetermined pitch interval in the Y-axis direction are ultrasonically solid-phase bonded.

The metals forming the wiring patterns 4a and 6a may be any metal capable of ultrasonic bonding (including alloy), such as silver, gold, aluminum, and alloys containing these as main components. Incidentally, an antioxidant film whose main component is titanium or so may be formed on the surface of these metals (particularly, the surface of aluminum).

In a method of manufacturing the board bonded body 8 of the present embodiment (including the ultrasonic bonding method), since the step wall surface 10c is formed on the stage 10, the electronic control board 4 and the flexible board 6 are easily positioned using the step wall surface 10c, and the wiring patterns 4a and 6a can ultrasonically be bonded. Thus, even if the wiring pitch interval in the Y-axis direction is small (e.g., tens of microns or less), the electronic control board 4 and the flexible board 6 are easily electrically connected without generation of short-circuit failure or so. Incidentally, it is preferred that the ultrasound does not vibrate in the lamination direction of the laminated portion (Z-axis direction), but vibrates in a direction along the longitudinal direction of the wiring patterns 4a and 6a to be bonded.

In recent years, a large display close to an outer casing size of a device (e.g., a display of smart phones) has been demanded. Thus, the bonding length x1 of the wiring patterns 4a and 6a must be short, and the connection reliability is becoming a problem. In the method of the present embodiment, however, the metals can ultrasonically be solid-phase bonded, and the connection becomes reliable.

In the method of manufacturing the board bonded body of the present embodiment, since the step wall surface 10c is formed on the stage 10, the wiring patterns can securely ultrasonically be bonded even if the laminated portion of the electronic control board 4 and the flexible board 6 has a large width in the Y-axis direction (e.g., 60 mm or more).

In the present embodiment, the movement mechanism is controlled by the control means so that the press part 50a of the ultrasonic horn 50 presses the laminated portion positioned on the lower-side surface 10a within a predetermined range from the step wall surface 10c. In the ultrasonic bonding, the press part 50a of the ultrasonic horn 50 does not preferably press the flexible board 6 positioned on the higher-side surface 10b, but preferably presses only the laminated portion. In this structure, the ultrasonic bonding of the wiring patterns 4a and 6a becomes more reliable without generation of disconnection of the wiring patterns or so.

Incidentally, the present invention is not limited to the above-mentioned embodiment, but may variously be changed within the scope of the present invention.

For example, the electronic control board 4 is not only a stiff board including a glass board, but may be a flexible board with softness.

The second flat member is the flexible board 6 in the above-mentioned embodiment, but is not limited.

DESCRIPTION OF THE REFERENCE NUMERICAL

2 . . . ultrasonic bonding device
4 . . . electronic control board (first flat member)
4a . . . wiring pattern
6 . . . flexible board (second flat member)
6a . . . wiring pattern
8 . . . board bonded body
10 . . . stage
10a . . . lower-side surface
10a1 . . . bonding position
10a2 . . . standby position
10b . . . higher-side surface
10c . . . step wall surface
11 . . . standby suction hole
12 . . . first suction hole
14 . . . second suction hole
20 . . . transportation head
30 . . . camera
50 . . . ultrasonic horn
50a . . . press part

What is claimed is:

1. An ultrasonic bonding device comprising:
   a stage for placing a first flat member and a second flat member to be bonded; and
   an ultrasonic horn including a press part to be pressed on a laminated portion of the first flat member and the second flat member,
   wherein the stage includes:
   a lower-side surface on which the first flat member is to be placed;
   a higher-side surface positioned higher than the lower-side surface by a predetermined step height and on which the second flat member is to be placed, the step height being less than a thickness of a part of the first flat member in the laminated portion;

a step wall surface positioned in a boundary between the lower-side surface and the higher-side surface; and a first fixing means for detachably fixing the first flat member on the lower-side surface so that an edge of the first flat member is positioned by contacting with the step wall surface.

2. The ultrasonic bonding device according to claim 1, wherein the stage further includes a second fixing means for detachably fixing the second flat member on the higher-side surface so that at least a part of the second flat member is laminated on the first flat member.

3. The ultrasonic bonding device according to claim 2, further comprising:

a movement mechanism for relatively moving the ultrasonic horn to the stage; and a control means for controlling the movement mechanism so that the press part of the ultrasonic horn presses the laminated portion at a position corresponding to the step wall surface.

4. The ultrasonic bonding device according to claim 3, wherein the movement mechanism is controlled by the control means so that the press part of the ultrasonic horn presses the laminated portion positioned on the lower-side surface in a predetermined range from the step wall surface.

5. An ultrasonic bonding method comprising the steps of:

preparing a stage including a lower-side surface, a higher-side surface positioned higher than the lower-side surface by a predetermined step height, and a step wall surface positioned in a boundary between the lower-side surface and the higher-side surface, the step height being less than a thickness of a part of a first flat member, the part of the first flat member being a part on which a part of the second flat member is laminated;

placing the first flat member on the lower-side surface so that an edge of the first flat member is aligned to the step wall surface;

placing the second flat member on the higher-side surface so as to form a laminated portion constituted by laminating at least the part of the second flat member on the first flat member; and pressing a press part of an ultrasonic horn against the laminated portion at a position corresponding to the step wall surface.

6. The ultrasonic bonding method according to claim 5, wherein a first metal is formed on a surface of the first flat member to be laminated with the second flat member, a second metal is formed on a surface of the second flat member to be laminated with the first flat member, and the first metal and the second metal are ultrasonically solid-phase bonded in the laminated portion to be contacted with the press part of the ultrasonic horn.

* * * * *